(12) United States Patent
Raabe et al.

(10) Patent No.: US 12,470,041 B2
(45) Date of Patent: Nov. 11, 2025

(54) SUBMOUNT ARCHITECTURE FOR MULTIMODE NODES

(71) Applicant: Cisco Technology, Inc., San Jose, CA (US)

(72) Inventors: Christian Rainer Raabe, Nuremberg (DE); Michael Tittenhofer, Fuerth (DE); Theodor Kupfer, Feucht (DE)

(73) Assignee: CISCO TECHNOLOGY, INC., San Jose, CA (US)

( * ) Notice: Subject to any disclaimer, the term of this patent is extended or adjusted under 35 U.S.C. 154(b) by 1013 days.

(21) Appl. No.: 17/381,694

(22) Filed: Jul. 21, 2021

(65) Prior Publication Data

US 2023/0026423 A1   Jan. 26, 2023

(51) Int. Cl.
*H01S 5/024* (2006.01)
*G02B 6/42* (2006.01)
*H01L 23/367* (2006.01)
*H01S 5/0234* (2021.01)
*H01S 5/02345* (2021.01)
*H01L 23/00* (2006.01)
*H01L 23/498* (2006.01)

(52) U.S. Cl.
CPC ........ *H01S 5/02469* (2013.01); *G02B 6/4214* (2013.01); *G02B 6/4245* (2013.01); *G02B 6/428* (2013.01); *H01L 23/367* (2013.01); *H01S 5/0234* (2021.01); *H01S 5/02345* (2021.01); *H01L 23/49816* (2013.01); *H01L 24/16* (2013.01); *H01L 2224/16225* (2013.01)

(58) Field of Classification Search
CPC .... G02B 6/4214; G02B 6/4245; G02B 6/428; H01S 5/02469
See application file for complete search history.

(56) References Cited

U.S. PATENT DOCUMENTS 6,252,726 B1 * 6/2001 Verdiell .............. H01S 5/02208
385/94
6,364,542 B1 * 4/2002 Deane .................. G02B 6/4201
385/88

(Continued)

OTHER PUBLICATIONS

"Terabit/s Packaging Design for Testing of High-Speed IC Transceivers", IBM, https://researcher.watson.ibm.com/researcher/view_group.php?id=4303, downloaded Jul. 21, 2021, 2 pages.

(Continued)

*Primary Examiner* — Daniel Petkovsek
(74) *Attorney, Agent, or Firm* — Edell, Shapiro & Finnan, LLC (57) ABSTRACT

Presented herein are a submount architecture for an electro-optical engine, which may be embodied as an apparatus in the form of at least an electro-optical engine and a multimode node, and a method for providing the same. According to at least one example, an apparatus includes a printed circuit board (PCB), a substrate with a finer structuring than the PCB, and electro-optical components. A bottom surface of the substrate is coupled to the PCB and electro-optical components are mounted on a top surface of the substrate. The electro-optical components include one or more optical components arranged to emit optical signals towards and/or receive optical signals from an area above the top surface of the substrate.

20 Claims, 5 Drawing Sheets

(56) References Cited

U.S. PATENT DOCUMENTS

| | | | |
|---|---|---|---|
| 6,384,472 B1 | 5/2002 | Huang | |
| 6,491,447 B2 * | 12/2002 | Aihara | G02B 6/4224 |
| | | | 385/92 |
| 6,945,712 B1 * | 9/2005 | Conn | G02B 6/4246 |
| | | | 385/94 |
| 9,507,086 B2 * | 11/2016 | Kobrinsky | G02B 6/30 |
| 10,901,161 B2 * | 1/2021 | Dede | H01S 5/02438 |
| 10,921,534 B2 * | 2/2021 | Dong | G02B 6/4245 |
| 2003/0185484 A1 | 10/2003 | Chakravorty et al. | |
| 2004/0208416 A1 | 10/2004 | Chakravorty et al. | |
| 2005/0156310 A1 | 7/2005 | Benner et al. | |
| 2006/0110110 A1 | 5/2006 | Yi et al. | |
| 2006/0132578 A1 | 6/2006 | Tu et al. | |
| 2011/0044367 A1 | 2/2011 | Budd et al. | |
| 2012/0326290 A1 | 12/2012 | Andry et al. | |
| 2014/0044388 A1 | 2/2014 | Su et al. | |
| 2014/0072311 A1 | 3/2014 | Giziewicz et al. | |
| 2014/0231635 A1 | 8/2014 | Kerness et al. | |
| 2015/0023377 A1 * | 1/2015 | Shastri | H01S 5/005 |
| | | | 372/36 |
| 2016/0085038 A1 * | 3/2016 | Decker | G02B 6/428 |
| | | | 385/14 |
| 2016/0124164 A1 | 5/2016 | Doerr | |
| 2019/0317285 A1 | 10/2019 | Liff et al. | |
| 2021/0088723 A1 | 3/2021 | Yu et al. | |
| 2023/0018654 A1 * | 1/2023 | Winzer | G02B 6/4268 |
| 2023/0028883 A1 * | 1/2023 | Raabe | G02B 6/4257 |

OTHER PUBLICATIONS

Fuad Et. Doany, et al., "Terabit/s-class 24-channel bidirectional optical transceiver module based on TSV Si carrier for board-level interconnects", 2010 Proceedings 60th Electronic Components and Technology Conference (ECTC), Jun. 2010, 8 pages.

* cited by examiner

SUBMOUNT ARCHITECTURE FOR MULTIMODE NODES

TECHNICAL FIELD

The present disclosure relates to a physical/mechanical architecture for multimode nodes, and, in particular, to a submount architecture for electro-optical nodes, such as optical transceivers.

BACKGROUND

Multimode nodes, such as optical transceivers, often include electro-optical components (collectively, the "electro-optical engine") on a printed circuit board (PCB). For example, some multimode nodes include a "chip on board" architecture where at least a laser, such as a Vertical-Cavity Surface-Emitting Laser (VCSEL), a photodetector, and one or more integrated circuits (ICs) are coupled directly to a PCB. Additionally, the components of an electro-optical engine are often interconnected by chip-to-chip bond wires. However, these two architectural features may limit the size and types of ICs (e.g., application specification ICs (ASICs)) that can be included in the electro-optical engine. These architectural features may also limit heat dissipation (e.g., due to coarse pin patterning on a PCB), which is increasingly important as higher power dissipating ICs continue to be developed.

In some instances, advanced board technology can be used to address these issues, but advances boards are often prohibitively expensive. Additionally, some solutions try to incorporate additional substrates, but often incorporate an excessive number of substrates. This may increase costs and/or create new issues. In view of the foregoing, improved electro-optical engines, as well as multimode nodes including the same, are desired.

DESCRIPTION OF EXAMPLE EMBODIMENTS

Overview

Presented herein are a submount architecture for an electro-optical engine, which may be embodied as an apparatus in the form of at least an electro-optical engine and a multimode node, and a method for providing the same. For example, according to at least one example embodiment, the present application is directed to an apparatus that includes a printed circuit board (PCB), a substrate with a finer structuring than the PCB, and electro-optical components. A bottom surface of the substrate is coupled to the PCB and electro-optical components are mounted on a top surface of the substrate. The electro-optical components include one or more optical components, such as a laser (e.g., a Vertical-Cavity Surface-Emitting Laser (VCSEL)) and/or a photo-detector), arranged to emit optical signals towards and/or receive optical signals from an area above the top surface of the substrate. Additionally or alternatively, one or more optical components of the electro-optical components dissipate heat along at least a first heat dissipation path and electrical components of the electro-optical components dissipate heat along at least a second heat dissipation path that is distinct from the first heat dissipation path.

As another example, according to at least some embodiments, the present application is directed to a method for providing or forming a multimode submount architecture that includes providing a PCB and mounting a bottom surface of a substrate with a finer structuring than the PCB to the PCB. The method also includes mounting electro-optical components on a top surface of the substrate, the electro-optical components including one or more optical components arranged to emit optical signals towards and/or receive optical signals from an area above the top surface of the substrate.

Example Embodiments

Presented herein are a submount architecture for multimode nodes and a method of forming the same. As is explained in detail below, the submount architecture provides the electro-optical engine on a substrate that, in turn, is coupled to a PCB. In fact, in some embodiments, the electro-optical engine includes one or more optical dies in the form of one or more lasers (e.g., one or more Vertical Cavity Surface Emitting Lasers (VCSELs)) and/or one or more photodetectors, as well as one or more electrical dies in the form of one or more integrated circuits (ICs), and the entire electro-optical engine is disposed on the substrate. The substrate has a finer structuring than a printed circuit board (PCB) on which it is mounted and can be connected to the PCB via a surface mount technology (SMT) interconnect, such as a ball grid array (BGA). Thus, the substrate provides more pathways, at least as compared to the PCB, along which components of the electro-optical engine can be interconnected and/or dissipate heat. In fact, in at least some embodiments, the optical dies of the electro-optical engine are connected to the electrical dies via the substrate so that the submount architecture does not include chip-to-chip bond wires. Wire bonds, which can limit the bandwidth of an electro-optical engine, can also be avoided by flip-chip bonding the electrical dies to the substrate.

Overall, the foregoing features may provide an electro-optical engine with improved bandwidth that can support advancing technology (e.g., a next generation of modules with increasing data rates). In fact, the foregoing features may achieve increased data rates while preserving signal integrity and power integrity. Additionally or alternatively, the foregoing features may allow the electro-optical engine to include larger ICs, at least as compared to conventional designs that bond the ICs directly to the PCB. For example, many conventional designs connect ICs to a PCB or substrate with wire bonds that, for bandwidth concerns, are often kept as short as possible. Thus, these IC wire bonds are often connected at a periphery of the IC, reducing the number of pads available at the periphery. To counteract this (e.g., to make more wire bond pads available the periphery), dies then become larger, which is expensive and creates additional issues. Moreover, when ICs are coupled directly to a PCB, this spacing is further limited by PCB technology, which often provides a limited number of wire bond fingers that can be brought close to the IC. Meanwhile, the limited number of pads available on a PCB may prevent an IC from being flip-chip bonded to the PCB. By comparison, if IC(s) are flip-chip bonded to a substrate, as proposed by the architecture presented herein, an electro-optical engine can accommodate ICs with increased pin counts.

Still further, although some conventional solutions use a substrate to try to resolve some of the foregoing issues, these solutions often introduce new issues. For example, some solutions utilize multiple substrates, thereby increasing the cost and complexity of the architecture (increased complexity may increase costs and/or risk of failure). Additionally or alternatively, some solutions with substrates orient the optical components to face the PCB so that a laser (e.g., the VCSEL) emits optical signals towards a PCB (i.e., downwards) and a photodetector receives signals from an area between the photodetector and the PCB. However, this type of arrangement creates issues relating to at least manufacturing and heat dissipation. The submount architecture presented herein is able to resolve these issues by orienting the optical components (e.g., the laser and/or photodetector) to emit signals towards and/or receive optical signals from an area above the PCB (and the substrate).

As a more specific example, flip-chip mounting a VCSEL on a substrate disposed above a PCB may significantly complicate manufacturing and/or significantly increase costs of an electro-optical engine. Similar problems will arise by flip-chip mounting a photodetector on a substrate disposed above a PCB. However, for simplicity, these issues are only discussed in detail below in connection with a VCSEL (as an example represented of issues with flip-chip bonding optical components to a substrate above a PCB).

First, to flip-chip bond a VCSEL to a substrate, the substrate will need to be carefully manufactured to align a hole, opening, or transparent section of the substrate with the downwardly oriented VCSEL. These features and this alignment may, in turn, may complicate the connection between the optical dies (e.g., VCSEL and photodetector) and the electrical dies. Flip-chip bonding the VCSEL to the substrate in this manner may also discourage heat dissipation since VCSELs naturally dissipate heat in a direction opposite to signal emission. That is, a flip-chip VCSEL emitting signals downwards will dissipate heat upwards, away from the substrate, requiring a heat dissipation path sufficient to cool a VCSEL, which is particularly heat sensitive (at least as compared to ICs, which can withstand more heat) to be created above the VCSEL. By comparison, the present application orients the laser (e.g., the VCSEL) upwards, away from the PCB and substrate. Thus, the electro-optical engine of the present application need not use or create a carefully curated substrate and/or can dissipate laser-generated heat through the substrate and PCB, which are often effective in dissipating heat, or at least the amount of heat generated by optical components of an electro-optical engine.

Second, in the foregoing example (e.g., a flip-chip VCSEL), optical transfer components (e.g., a waveguide) would likely need to be mounted on/in the PCB to route optical signals laterally along the PCB (e.g., parallel to a top surface of the PCB). Not only does this require the substrate to be spaced from the PCB by enough room to accommodate the optical transfer components (and/or limit the size/type of the optical transfer component), potentially increasing the length of bonds therebetween, but it also likely requires a waveguide or like component to be installed on the PCB prior to coupling the substrate to the PCB. This order of assembly is problematic because many optical transfer components (e.g., plastic components) cannot withstand the compression and heat that is often preferred for bonding dies and/or substrates to a PCB. Additionally, if the optical transfer components (e.g., a waveguide) are installed prior to the optical dies, the optical dies must be aligned with the optical transfer components (e.g., precisely spaced) while bonding the optical dies (e.g., a VCSEL) to the substrate, which may be difficult and/or imprecise. That is, since the flip-chip bonding does not allow for adjustments, this order of assembly only allows for "passive alignment" of the optical dies/components with a preexisting optical transfer component.

By comparison, as is detailed below, in the present application, one or more optical components (e.g., the laser and/or photodetector) can be wire bonded to a substrate prior to installation of optical transfer components. Then, the optical transfer components can be "actively aligned" with secured/installed optical component(s) (e.g., a laser, such as a VCSEL, and/or photodetector), insofar as an "active alignment" allows adjustments during installation to ensure proper optical spacing. Moreover, since the optical transfer components can be installed after coupling the optical and electrical dies of an electro-optical engine to a substrate, the optical transfer components are not at risk of being damaged by compression or heat used during these assembly steps. Thus, plastic or other materials susceptible to heat and/or compression can be used to form the optical transfer components.

Figure 1:
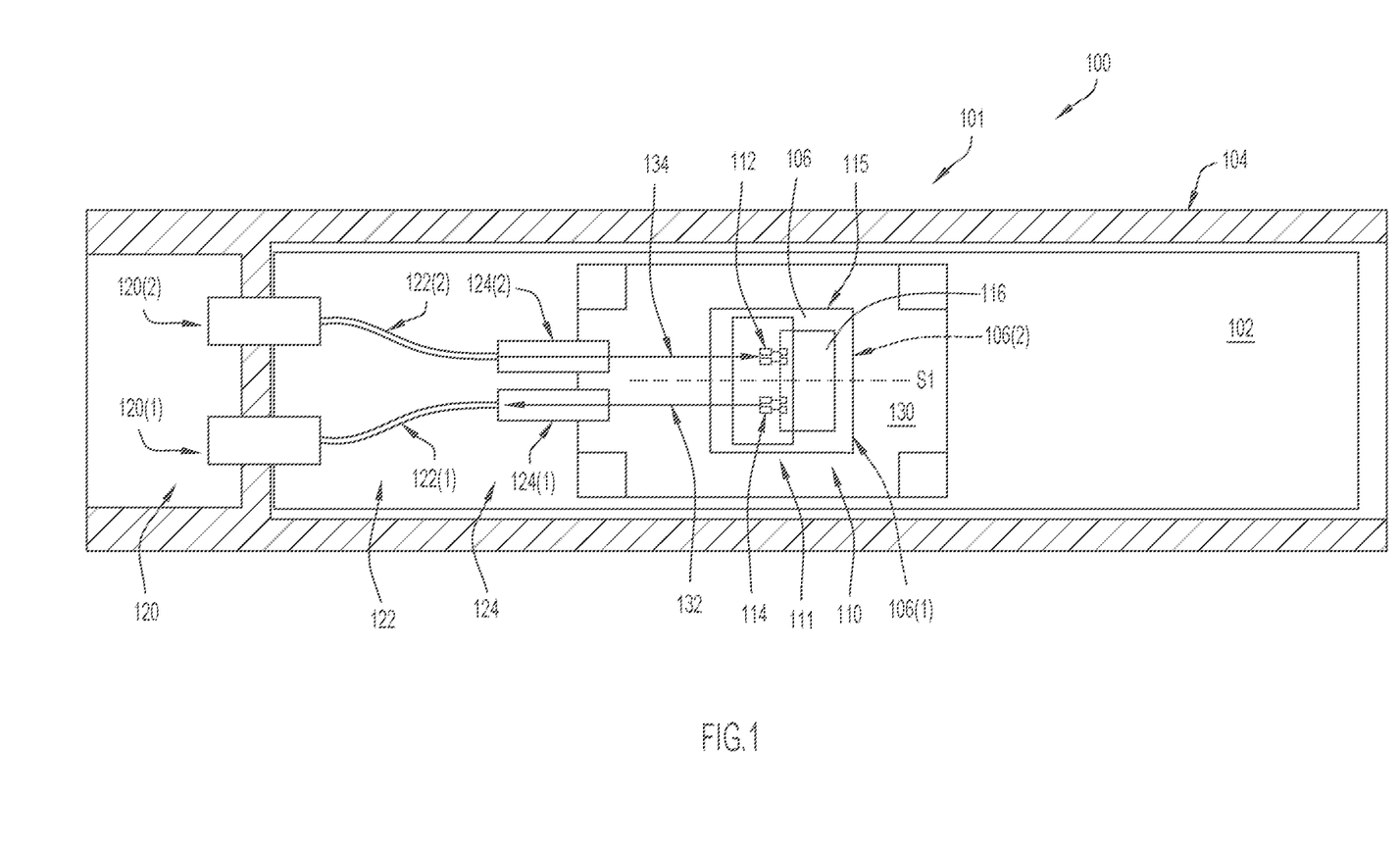
FIG. 1 is a top sectional view of a multimode node including a submount architecture for an electro-optical engine, according to an example embodiment of the present application.

Now referring to FIG. 1 for a description of a multimode node 100 with a submount architecture 101 formed in accordance with an example embodiment of the present application. Node 100 includes a PCB 102 disposed within a housing 104. A substrate 106 sits atop the PCB 102 and supports an electro-optical engine 110. In fact, in at least some embodiments the substrate 106 supports the entire electro-optical engine 110. The substrate 106 may be formed from any desirable substrate material and may be any shape or size; however, the substrate 106 should have a finer pattering/structuring than the PCB 102 to allow more mounting and power delivery options/arrangements than the PCB 102.

In the depicted embodiment, the electro-optical engine 110 includes optical dies/components 111 in the form of a photodetector 112 and a laser 114. In at least some embodiments, the laser 114 comprises a Vertical-Cavity Surface-Emitting Laser (VCSEL); however, a VCSEL is just an example and, in other embodiments, the laser may include any laser capable of generating and emitting signals. Moreover, the depicted optical dies/components 111 are merely examples and, in other embodiments, the electro-optical engine 110 may include any combination of optical components. For example, in some embodiments, optical dies/components 111 may include multiple photodetectors and/or multiple lasers, arranged in any desired arrangement, such as to provide a multichannel arrangement. That is, for a multichannel application, electro-optical engine 110 may include several lasers and/or photodetectors, and combinations of these components may form a portion of a single electro-optical assembly (e.g., a single channel). Additionally or alternatively, the optical dies/components 111 may include photodetectors without lasers or lasers without photodetectors. That is, the architecture presented herein may be suitable for receivers, transmitters, and/or transceivers.

Additionally, the electro-optical engine 110 includes an electrical component 115 in the form of an application specification integrated circuit (IC) 116 that includes a driver IC and a transimpedance amplifier (TIA). However, electrical component 115 are merely examples and, in other embodiments, the electro-optical engine 110 may include any combination of electrical components. For example, in some embodiments, the electrical components 115 may include distinct ICs for the driver IC and TIA. Additionally or alternatively, the electrical components 115 may include multiple driver ICs and TIAs (or similar components) arranged in any desired arrangement, for example, to provide a multichannel arrangement and/or to operate/interact with photodetectors without lasers or lasers without photodetectors. That is, the electrical components 115 presented herein may be suitable for receivers, transmitters, and/or transceivers.

Regardless of the specific components included in the electro-optical engine 110, each of the optical dies/components 111 is connected to an electrical component(s) 115 via the substrate 106. However, to be clear, substrate 106 need not be a single substrate. For example, if the architecture presented herein is used to support a multichannel electro-optical assembly, any combination of channels may be supported on any number of substrates. As a specific example, components for each channel of a multichannel electro-optical assembly may be mounted on different substrates. That is, a multichannel electro-optical assembly may be organized on a substrate per channel basis, such as with each substrate in an architecture supporting a laser, a photodetector, a driver IC, and a TIA. Additionally or alternatively, components of one or more transmitter assemblies may be mounted on one or more substrates while components of one or more receiver assemblies may be mounted on one or more other substrates.

To illustrate at least one of the aforementioned substrate concepts, FIG. 1 includes an illustrative split S1. If substrate 106 were split into two separate substrates along split S1, substrate 106(1) would be the receiver substrate and substrate 106(2) would be the transmitter substrate. That is, substrate 106(1) would support components suitable to form a receiver assembly while substrate 106(2) would support components suitable to form a transmitter assembly. Meanwhile, to form a multi-channel transmitter and/or receiver, the entire substrate 106, substrate 106(1), and/or substrate 106(2) could support multiple optical and/or electrical components.

Figure 2:
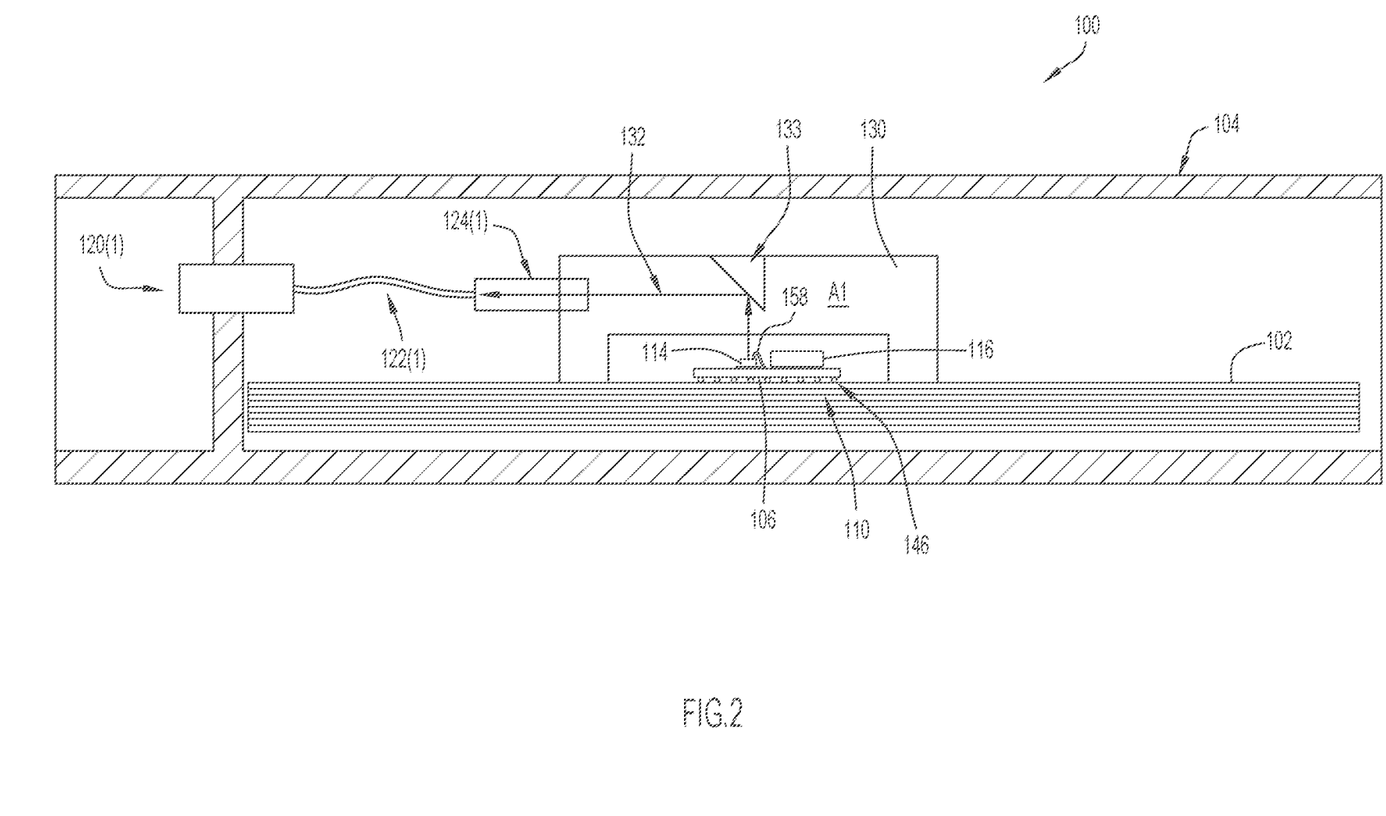
FIG. 2 is a side sectional view of the multimode node of FIG. 1.

Still referring to FIG. 1, but now in combination with FIG. 2, the photodetector 112 and laser 114 may communicate with components that are external to multimode node 100 via ports 120. The ports 120 are connected to the optical components (photodetector 112 and laser 114) via fiber 122, fiber connectors 124, and an optical transfer assembly 130. More specifically, as is illustrated in FIG. 1, the laser 114 may emit optical signals 132 that are directed to port 120(1) by the optical transfer assembly 130, fiber connector 124(1), and fiber 122(1). Meanwhile, the photodetector 112 may receive optical signals 134 that are received at port 120(2) and directed to photodetector 112 by fiber 122(2), fiber connector 124(2), and the optical transfer assembly 130. As can be seen in FIG. 2, the optical transfer assembly includes one or more lenses 133 to deflect, reflect, and/or guide optical signals from the laser 114 to the fiber connector 124(1). Although not explicitly shown in FIG. 2, the lenses 133 may also deflect, reflect, and/or guide optical signals from fiber connector 124(2) to the photodetector 112. Moreover, to be clear, while the fiber connectors 124 are depicted as interconnect-like components, this is merely an example and fibers 122 could be coupled directly to optical transfer assembly 130 (e.g., glued to optical transfer assembly 130).

In the embodiment depicted in FIGS. 1 and 2, the optical transfer assembly 130 is mounted on PCB 102, but this is just an example and in some embodiments, the optical transfer assembly 130 may be mounted to the substrate 106 (e.g., as discussed below in connection with FIG. 4). Regardless, since the optical transfer assembly 130 is mounted above the electro-optical engine 110, the optical transfer assembly 130 can be carefully positioned to precisely align the lens(es) 133 with the optical components 111 of the electro-optical engine 110, both longitudinally (e.g., vertically in the figures) and laterally (e.g., horizontally in the figures). Moreover, regardless of how the optical transfer assembly 130 is positioned, the optical components 111 of the electro-optical engine 110 presented herein are arranged to emit optical signals towards and/or receive optical signals from an area A1 (generally denoted in FIG. 2) above the top surface 148 (see FIG. 3) of the substrate 106. Specifically, the laser 114 is arranged to emit optical signals towards area A1 and photodetector 112 is arranged to receive signals from area A1.

Figure 3:
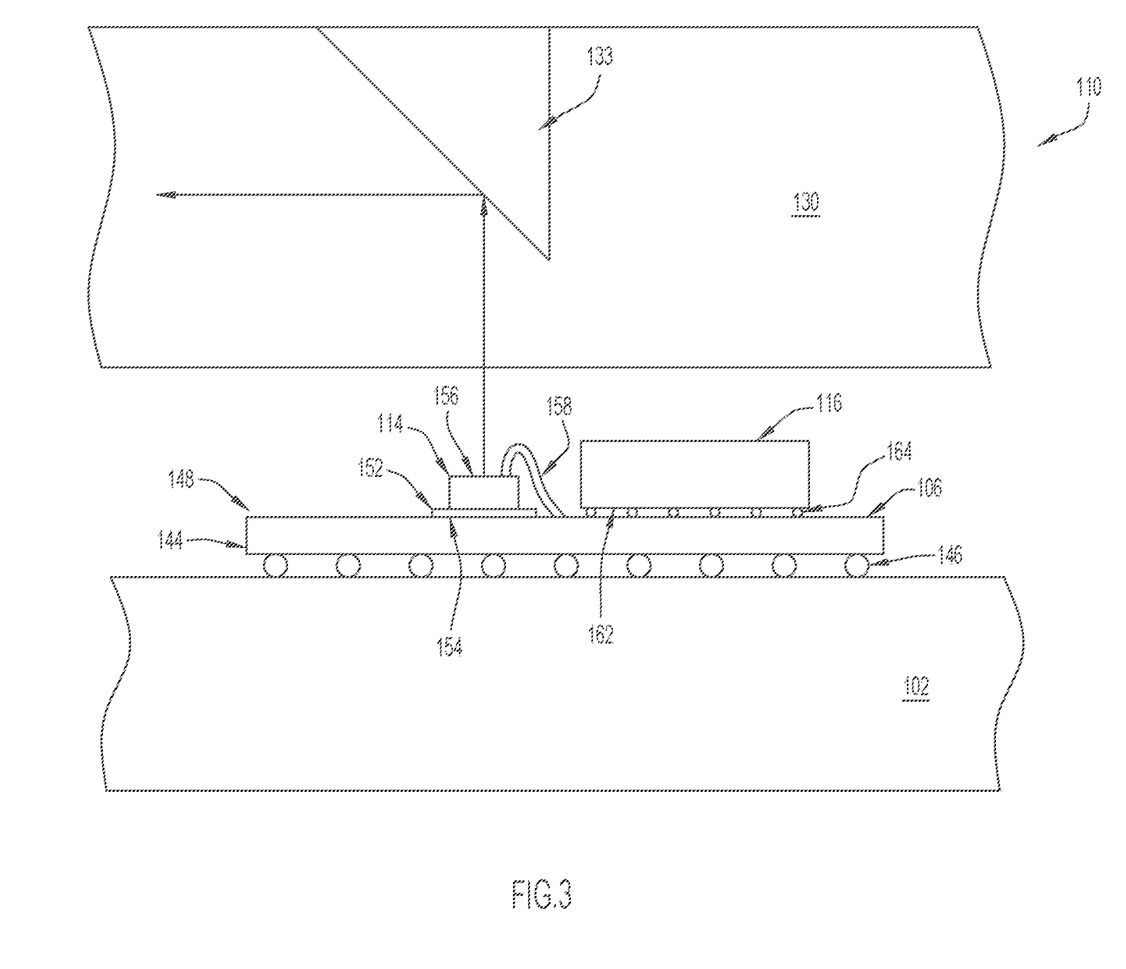
FIG. 3 is a detail view of FIG. 2 showing a close-up view of the submount architecture.

Now turning to FIG. 3 for a description of a detailed view of the electro-optical engine 110, which shows bonds between the various components of electro-optical engine 110. Specifically, FIG. 3 illustrates how: (1) the substrate 106 is connected to the PCB 102; (2) the laser 114 is connected to the substrate 106; and (3) the IC 116 is connected to the substrate 106. Each of these connections is addressed in turn below. However, to be clear, these are example connections and one or more of these connections could potentially be used in combination with components connected in different manners. Moreover, since FIG. 3 provides a detailed side view of the embodiment of FIGS. 1 and 2, FIG. 3 only shows the laser 114 and a single electrical component 115. However, the depicted connections may be representative of connections that can be used across like components. For example, any number of electrical components 115 could be coupled to the substrate 106 in the manner shown for IC 116 in FIG. 3. Likewise, the photodetector 112, or any other optical component 111, could be coupled to the substrate 106 in the manner shown for laser 114 in FIG. 3.

Now turning to the aforementioned connections, first, a bottom surface 144 of substrate 106 is coupled to the PCB 102 via a BGA 146. The BGA 146 provides a plurality of heat dissipation paths while also providing an operative coupling that preserves power and signal integrity. However, in other embodiments, the substrate 106 might be attached to the PCB 102 in any manner now known or developed hereafter that operatively couples the substrate 106 to the PCB 102 while allowing heat dissipation and preserving power and signal integrity. That is, BGA 146 is merely representative of a surface mount technology (SMT) interconnect and, in other embodiments, BGA 146 could be a Land Grid Array (LGA), Quad Flat No-Leads (QFN), or any other type of SMT interconnect.

Second, the laser 114 and IC 116 are coupled to a top surface 148 of the substrate 106. Specifically, a bottom surface 152 of the laser 114 is secured to the top surface 148 of the substrate 106 via an adhesive 154 while a wire bond 158 extends between a top surface 156 of the laser 114 and the top surface 148 of the substrate 106 to operatively couple the laser 114 to the substrate 106. Moreover, since the laser 114 (e.g., a VCSEL) is arranged to emit signals 132 upwards, the laser 114 is not flip-chip bonded to the substrate 106. However, the laser 114 is also not wire bonded directly to the electrical component(s) 115 (e.g., IC 116). Instead, the laser 114 is coupled to the substrate 106 via a wire bond 158 and is coupled to the electrical component(s) 115 (e.g., IC 116) via the substrate 106 (e.g., via a conductive trace 205). Consequently, the length of the wire bond 158 is minimized and the electro-optical engine does not include chip-to-chip bond wires/wire bonds. Moreover, since the laser 114 is arranged to emit signals 132 upwards, the laser 114 will dissipate heat downwards, into the substrate 106 (as mentioned, this description is also representative of the photodetector, which will receive downwardly directed signals and will also emit heat downwards). Thus, the adhesive 154 is preferably formed from a material that can conduct heat without deteriorating (or with minimal deterioration) so that, for example, heat dissipating from the laser 114 (e.g., VCSEL) may dissipate through the adhesive 154 without destroying the mechanical bond provided by the adhesive 154.

Third, a bottom surface 162 of the IC 116 is coupled to the top surface 148 of the substrate 106 via a flip-chip bonding 164. To flip-chip bond the IC 116, the ICs are flipped upside down so that a top surface of the IC 116 is proximate the substrate and a bottom surface faces "upwards." Since ICs often dissipate heat primarily from their bottom surface, a flip-chip bonded IC will primarily dissipate heat upwards (from its upside-down bottom surface). Additionally, flip-chip bonding the IC 116 (or any other electrical component 115) to the substrate 106 enables the electro-optical engine 110 to include advanced ICs 116 (e.g., advanced ASICs) that might need more power/signal integrity than a wire bond can provide. These advanced ASICs/ICs may provide improved radio frequency (RF) performance and improved signal integrity, at least as compared to ASICs/ICs that are connected to a PCB/substrate via a wire bond. However, notably, due to the overall architecture of the electro-optical engine 110, these advanced ASICs/ICs can be used without the disadvantages associated with a downwardly emitted optical signal. Moreover, when the IC 116 is flip-chip bonded to the substrate 106, the IC 116 can dissipate heat upwards and/or downwards, so that, for example, heat generated by optical components 111 of electro-optical engine 110 dissipates separately from heat generated by electrical components 115 of electro-optical engine 110, as is discussed in further detail below.

Figure 4:
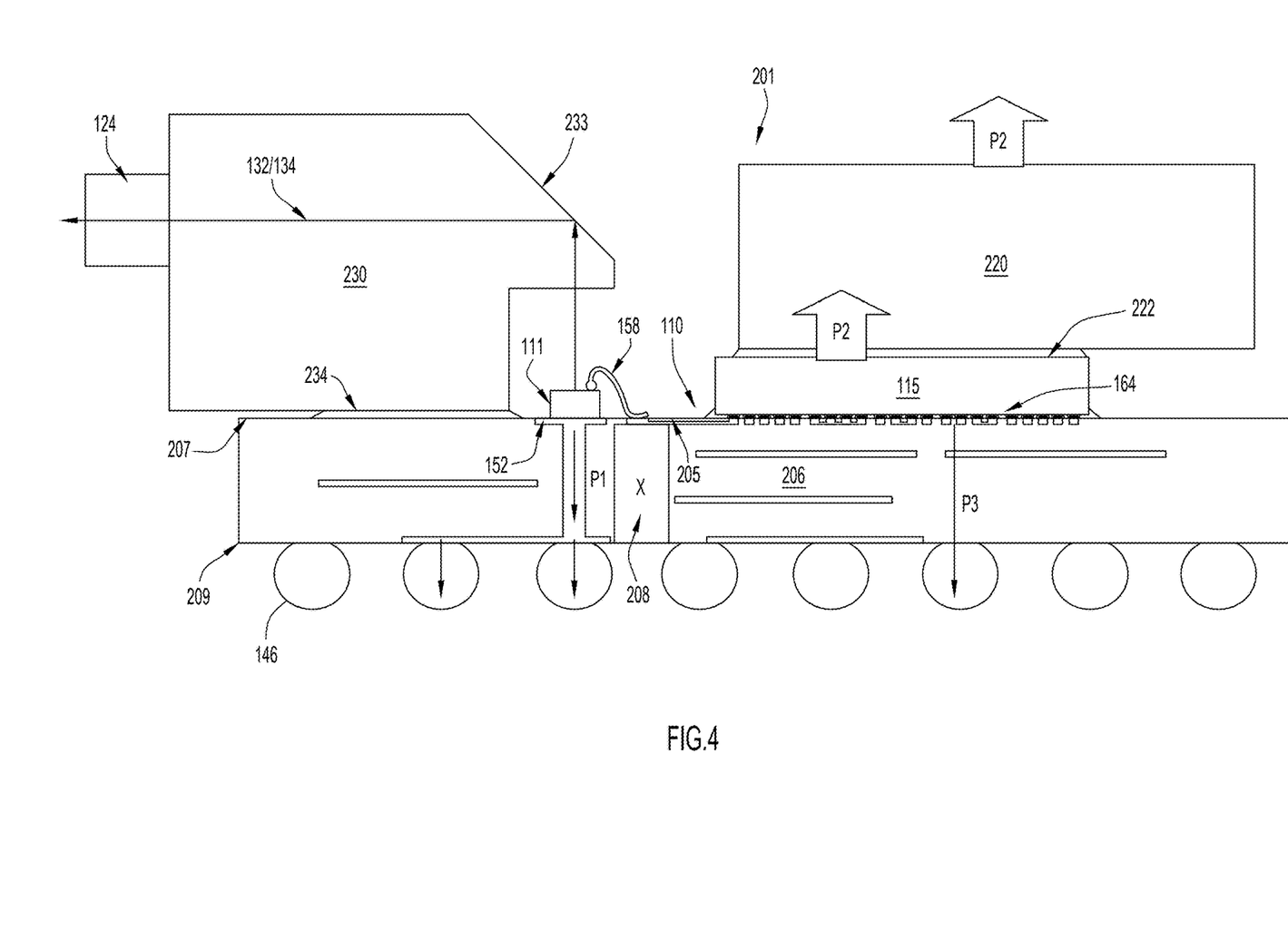
FIG. 4 is a side view of a submount architecture for an electro-optical engine, according to another example embodiment of the present application.

Now turning to FIG. 4 for a description of a submount architecture 201 formed in accordance with another example embodiment of the present application. This embodiment is similar to the embodiment depicted in FIGS. 1-3 and, thus, like components are labeled with like reference numerals. Moreover, for brevity, like components are not described in detail below and any description of components of submount architecture 101 included above should be understood to apply to like components of FIG. 4. Instead, the description of FIG. 4 focuses on differences between submount architecture 201 and submount architecture 101.

One difference between submount architecture 201 and submount architecture 101 is that submount architecture 201 includes a substrate 206 that actively separates heat dissipation of the optical components 111 (of the electro-optical engine 110) from heat dissipation of the electrical components 115 (of the electro-optical engine 110). Specifically, a thermal void 208 defines a thermal boundary in the substrate 206 between the optical components 111 and the electrical components 115. In other words, the thermal void 208 is disposed laterally between the optical components 111 and the electrical components 115 of the electro-optical engine 110. Generally, the thermal void 208 is a thermally nonconductive region, or at least a region of lower thermal conductivity as compared to the remainder of substrate 206. Thus, positioning the thermal void 208 laterally between the optical components 111 and the electrical components laterally separates heat dissipation of the optical components 111 from heat dissipation of the electrical components 115.

Put another way, the thermal void 208 essentially divides the substrate 206 into a first section and a second section. The first section can be dedicated to cooling the optical components 111 and the second section can be dedicated to cooling the electrical components 115. Alternatively, the second section may not include any cooling-specific features (i.e., may not provide a heat dissipation path). However, the thermal void 208 should not completely isolate the first section of the substrate 206 from the second section of the substrate, as the substrate 206 still operatively connects the optical components 111 to the electrical components 115 of the electro-optical engine 110. In the depicted embodiment, conductive pathway 205 extends above the thermal void 208 to connect the optical components 111 to the electrical components 115. However, conductive pathway 205 is not connected to (e.g., not touching) any heat pathways formed in the substrate 206, which are discussed in detail below.

Another difference between submount architecture 201 and submount architecture 101 is that submount architecture 201 includes a heat sink 220 mounted atop the electrical components 115. This arranges the heat sink 220 adjacent a bottom, heat-dissipating surface of the upside-down, flip-chip bonded electrical components 115. That is, in the depicted embodiment, the heat sink 220 is coupled to a bottom surface of the electrical components 115 (which are oriented vertically upwards in the Figures, after the flip-chip bonding) of the electro-optical engine 110, which dissipates heat for the electrical components 115. The heat sink 220 is coupled to this heat-dissipating surface via a thermal interface material (TIM) 222; however, in other embodiment, the heat sink 220 may be coupled to the electrical components 115 in any desirable manner (with or without a TIM). Moreover, although FIG. 4 depicts heat sink 220 as a rectangle, this is merely representative and the heat sink 220 may include any desirable heat dissipating features, such as fins, conductive pathways, etc. Regardless of the exact construction of the heat sink 220, the heat sink 220 guides heat generated by electrical components 115 (and dissipated by the upside down bottom surface) upwards, along heat pathway P2, moving away from the electrical components 115, the substrate 206, and a PCB 102 to which the substrate 206 is coupled.

By comparison, a heat pathway P1 for the optical components 111 directs heat downwards through the substrate 206, from a top surface 207 of the substrate 206 to a bottom surface 209 of the substrate 206, and exits the substrate 206 via the BGA 146 (which, again, is merely representative of a surface mount technology (SMT) interconnect). The BGA 146 can conduct and spread the heat dissipating from the optical components 111 (i.e., heat can spread across any balls that are interconnected on a first side of the thermal void 208) and, then, the heat can dissipate through heat dissipation pathways included in the PCB 102. Thus, generally heat pathway P1 and heat pathway P2 extend in opposite directions. Consequently, the heat dissipating from the optical components 111 will be substantially prevented from thermally coupling with heat dissipating from the electrical components 115. This may be advantageous since optical components 111 and electrical components 115 typically have different maximum temperature ratings and heat dissipation rates.

For example, ICs included in electrical components 115 may dissipate more heat than optical components 111 (e.g., laser 114 and photodetector 112). For example, optical components may dissipate about 20 mW of power while electrical components may dissipate power that is several orders of magnitude larger, such as about 2 W-15 W of power. Moreover, optical components 111 may need to be maintained at cooler temperatures than electrical components 115, such as at temperatures that are at least approximately 20-40° C. cooler than temperatures of the electrical components 115 (e.g., an IC may have a maximum temperature of 120° C. while optical components may have a maximum temperature of 80-85° C.). Thus, if the heat dissipation paths are thermally coupled, the excess heat dissipation of the electrical components 115 can adversely influence cooling of the optical components 111 (e.g., by creating more heat than the optical components 111 are configured to handle).

To combat this, some architectures may use precious node space to handle the total heat dissipation, even though the electrical components do not need extra cooling features. That is, designing an entire architecture to accommodate the heat/power requirements of the optical components may over-design the architecture, increasing the costs and/or limiting the space available for electro-optical engine 110. Dissipating thermally coupled heat may also create unwanted thermal gradients across an electro-optical engine.

By comparison, at least because the present application provides a first thermal pathway P1 that dissipates heat from optical components 111 in a first direction and a second thermal pathway P2 that dissipates heat from electrical components 115 in a second direction, opposite the first direction, the present application decouples the heat of electrical and optical components, allowing each to cool independently. Moreover, heat pathways P1 and P2 can each be specifically designed (e.g., sized) for a specific thermal load and need not account for heat dissipated by components operating at different power requirements/heat dissipation levels. Decoupling the optical and electrical thermal pathways (e.g., P1 and P2, respectively) also produces improved thermal balance across the electro-optical engine 110. Notably, although the thermal void 208 is not necessarily dispositive to the thermal decoupling between heat pathways P1 and P2, the thermal void 208 may still be described as separating heat pathways P1 and P2 since the thermal void 208 may be disposed laterally between heat pathways P1 and P2.

However, that all said, in at least some embodiments, pathway P2 need not be the only heat dissipation pathway for the electrical components 115 and, if desired/needed, the electrical components 115 can also dissipate heat along a third heat pathway P3 through the substrate 106, BGA 146, and/or a PCB 102 on which the substrate 106 is mounted. Alternatively, in some embodiments, the submount architecture presented herein may include the third heat pathway P3 instead of the second heat pathway P2. In FIG. 4, a conductive pathway is not depicted within substrate 206 for heat pathway P3 and, instead, heat pathway P3 is generally depicted as extending through substrate 206. However, in at least some embodiments, the substrate 206 may include a conductive pathway to guide heat from the top surface 207 of the substrate 206 to the bottom surface 209 of the substrate 206, e.g., similar to heat pathway P1. That is, the third heat pathway P3 may allow heat to dissipate parallel to heat pathway P1, but on opposite sides of thermal void 208 (i.e., in the same direction, but spaced by thermal void 208). In at least some embodiments (e.g., embodiments with pathways P2 and P3), the third pathway P3 is substantially smaller (e.g., smaller cross-section) than the first pathway P1. Regardless, at least because of thermal void 208, the first heat pathway P1 will be thermally decoupled from the third heat pathway P3 (and/or the second pathway P2). That is, at least because of thermal void 208, the first pathway P1 and third pathway P3 (and/or the second pathway P2) will be disposed in different sections of the substrate 206 that are substantially thermally isolated from each other.

Still referring to FIG. 4, submount architecture 201 is also specifically designed to accommodate an optical transfer assembly 230 to be mounted on the substrate 206. Generally, the optical transfer assembly 230 is similar to optical transfer assembly 130 in that it includes lenses 233 and/or other optical components to deflect, reflect, and/or guide optical signals 132/134 between optical components 111 and fiber connectors 124. However, now, the optical transfer assembly 230 is coupled to the substrate 206 via an adhesive 234, such as an epoxy. Mounting the optical transfer assembly 230 to the substrate 206 (instead of the PCB 102) simplifies the optical alignment between the optical transfer assembly 230 and the optical components 111 of the electro-optical engine 110. This is at least because the alignment no longer needs to account for any mechanical variations introduced by the connection between the substrate 206 and a PCB (e.g., BGA 146). Instead, the optical components 111 can be installed on the substrate 206 and the optical transfer assembly 230 can be mounted there over in optical alignment. Since the optical components 111 are preinstalled, the installation of the optical transfer assembly 230 can also be adjusted to account for any positioning variability experienced when the optical components 111 were mounted to the substrate 206 (e.g., due to thermal expansion and/or a mismatch in thermal expansion coefficients). Moreover, mounting the optical transfer assembly 230 directly on the substrate can reduce the distance between the optical components, further limiting the risk of optical misalignment.

Figure 5:
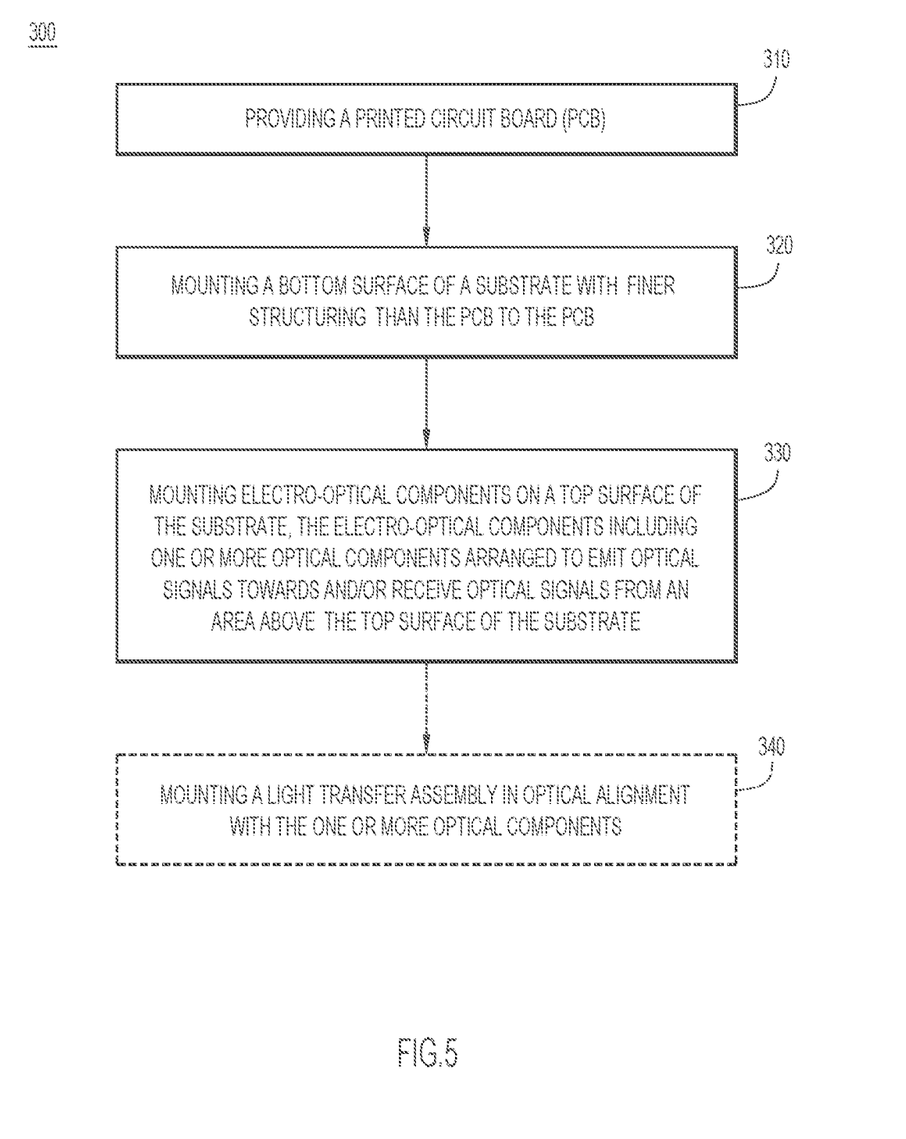
FIG. 5 is a flow chart illustrating a method for providing/forming a submount architecture for an electro-optical engine, according to an example embodiment.

Now turning to FIG. 5, a flow chart of a method 300 for providing or forming a submount architecture in accordance with an example embodiment of the present application is shown. Initially, at 310, a PCB is provided. A bottom surface of a substrate with a finer structuring/patterning than the PCB is mounted to the PCB at 320. For example, the bottom surface of the substrate may be mechanically and operatively coupled to the PCB via a SMT interconnect, such as a BGA, LGA, QFN, or any other type of SMT interconnect. At 330, electro-optical components are mounted on a top surface of the substrate. The electro-optical components include one or more optical components arranged to emit optical signals to and/or receive signals from an area above the top surface of the substrate. For example, the one or more optical components may include one or more lasers (e.g., one or more VCSELs) arranged to emit optical signals away from the top surface of the substrate and/or one or more photodetectors arranged to receive signals from an area above the top surface of the substrate.

As mentioned above, since the one or more optical components are arranged to emit optical signals to and/or receive signals from an area above the top surface of the substrate, the submount architecture will realize heat dissipation and assembly advantages, at least as compared to architectures that emit signals or receive signals from an area between a substrate and a PCB (e.g., emit signals downwards, towards a PCB). For example, since one or more optical components are arranged to emit optical signals to and/or receive signals from an area above the top surface of the substrate, an optical transfer assembly (e.g., a waveguide or "light turn") need not be mounted to the substrate/PCB prior to installation of the electro-optical components. Thus, electro-optical components can be mounted to the substrate with compression and/or heat, such as via flip-chip bonding, without risk of damaging a heat/compression susceptible optical transfer assembly.

Moreover, since the one or more optical components are arranged to emit optical signals to and/or receive signals from an area above the top surface of the substrate, the optical components may dissipate heat downwards, through a heat dissipation path formed in the substrate and/or PCB. In fact, in at least some embodiments, electrical components of the electro-optical components may be flip-chip bonded to the substrate and may dissipate heat upwards (since electrical components typically dissipate heat from a bottom surface, which defines a top of the electrical component when the component is flipped upside down for flip-chip bonding), in an opposite direction of optical heat dissipation. This may thermally decouple heat dissipation of the optical components from heat dissipation of the electrical components, providing a balanced thermal gradient across the electro-optical engine and maximizing the efficiency of the cooling features included in the submount architecture, as is described in detail above. Additionally, this may ensure that optical components of the electro-optical engine, which are typically the most heat sensitive components of the electro-optical engine (e.g., optical components may have a maximum temperature of 80-85° C.), can dissipate heat through the substrate and PCB without interference or overloading of the PCB heat dissipation pathways. By comparison, electrical components, which are typically more robust (e.g., an IC may have a maximum temperature of 120° C.), may dissipate heat through pathways extending away from the substrate/PCB, which may be the most effective (lowest thermal resistance) heat dissipation pathway Optionally, in some embodiments of method 300, an optical transfer assembly may, at 340, be mounted in optical alignment with any optical components of the electro-optical assembly, after installation of the electro-optical components (since this is optional, 340 is shown in dashed lines). When the optical transfer assembly is mounted after installation of the electro-optical components, the optical transfer assembly will not be subjected to forces, heat, etc. generated during bonding/mounting steps of the submount assembly formation method 300 (e.g., at 320 and/or 330). Thus, in at least some embodiments, the optical transfer assembly may be manufactured/formed from materials that are susceptible to (e.g., deform in response to) heat and/or compression, such as one or more plastics. Moreover, when the optical transfer assembly is installed after securing/mounting the electro-optical engine in place, the optical transfer assembly can be actively aligned with optical components of the electro-optical engine. That is, the optical transfer assembly can be precisely positioned to properly guide, deflect, reflect, etc. optical signals and can account for mechanical variations that might have been experienced during installation/mounting of the optical components (e.g., due to thermal expansion). Still further, since the optical transfer assembly is installed above the electro-optical engine, the optical transfer assembly will not be unnecessarily size constrained and can be/include advanced technologies that are relatively large (e.g., too big to be disposed between a substrate and a PCB)

In one form, an apparatus is provided comprising: a printed circuit board (PCB); a substrate with a finer structuring than the PCB, wherein a bottom surface of the substrate is coupled to the PCB; and electro-optical components mounted on a top surface of the substrate, the electro-optical components including one or more optical components arranged to emit optical signals towards and/or receive optical signals from an area above the top surface of the substrate.

In some of these embodiments, the electro-optical components further comprise an integrated circuit that is coupled to the top surface of the substrate via flip-chip bonding. Additionally or alternatively, optical components of the electro-optical components are connected to electrical components the electro-optical components via the substrate. For example, the optical components can include a laser that is coupled to the substrate via a wire bond so that the apparatus does not include chip-to-chip bond wires. Still further, in some embodiments, the apparatus includes an optical transfer assembly coupled to and extending from the substrate.

Moreover, in some embodiments, one or more optical components of the electro-optical components dissipate heat along at least a first heat dissipation path and electrical components of the electro-optical components dissipate heat along at least a second heat dissipation path that is distinct from the first heat dissipation path. For example, the substrate can include a thermal void that defines a thermal boundary between the first heat dissipation path from the second heat dissipation path. Additionally or alternatively, the first heat dissipation path may exit the substrate at the bottom surface of the substrate and the second heat dissipation path may extend in a direction away from the top surface of the substrate. For example, the apparatus may include a heat sink disposed above the substrate, and the heat sink may form at least a portion of the second heat dissipation path.

In another form, a method is provided comprising: providing a printed circuit board (PCB); mounting a bottom surface of a substrate with a finer structuring than the PCB to the PCB; and mounting electro-optical components on a top surface of the substrate, the electro-optical components including one or more optical components arranged to emit optical signals towards and/or receive optical signals from an area above the top surface of the substrate.

In some of these embodiments, the method further comprises: mounting the bottom surface of the substrate to the PCB with a surface mount technology (SMT) interconnect. Additionally or alternatively, the electro-optical components further comprise an integrated circuit and the method further comprises: coupling the integrated circuit to the top surface of the substrate via flip-chip bonding. Still further, in some embodiments, the method further comprises connecting the one or more optical components of the electro-optical components to one or more electrical components the electro-optical components via the substrate. For example, the one or more optical components may include a laser and the method may include coupling the laser to the substrate via a wire bond. Moreover, in some embodiments, the method further comprises: mounting an optical transfer assembly above the one or more optical components, in optical alignment with the one or more optical components.

In still another form, an apparatus is provided comprising: a printed circuit board (PCB); a substrate with a finer structuring than the PCB, wherein a bottom surface of the substrate is coupled to the PCB; and electro-optical components mounted on a top surface of the substrate, wherein one or more optical components of the electro-optical components dissipate heat along at least a first heat dissipation path and one or more electrical components of the electro-optical components dissipate heat along at least a second heat dissipation path that is distinct from the first heat dissipation path.

In some of these embodiments, the substrate includes a thermal void that defines a thermal boundary the first heat dissipation path from the second heat dissipation path. Additionally or alternatively, the first heat dissipation path exits the substrate at the bottom surface of the substrate and the one or more electrical components are flip-chip bonded so that the second heat dissipation path extends in a direction away from the top surface of the substrate. For example, the apparatus can include a heat sink disposed above the substrate, and the heat sink can form at least a portion of the second heat dissipation path. Still further, in some embodiments, the substrate also defines a third heat dissipation path that allows heat to dissipate substantially parallel to the first heat dissipation path or the second heat dissipation path.

It is also to be understood that unless otherwise specified, the submount architecture described herein, or portions thereof may be fabricated from any suitable material or combination of materials, such as plastic, foamed plastic, wood, cardboard, pressed paper, metal, supple natural or synthetic materials including, but not limited to, cotton, elastomers, polyester, plastic, rubber, derivatives thereof, and combinations thereof. Suitable plastics may include high-density polyethylene (HDPE), low-density polyethylene (LDPE), polystyrene, acrylonitrile butadiene styrene (ABS), polycarbonate, polyethylene terephthalate (PET), polypropylene, ethylene-vinyl acetate (EVA), or the like. Suitable foamed plastics may include expanded or extruded polystyrene, expanded or extruded polypropylene, EVA foam, derivatives thereof, and combinations thereof.

Moreover, the present application may reference spatial relationships between various components and the spatial orientation of various aspects of components depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Still further, the present disclosure may repeat reference numerals and/or letters in the various examples. This repetition is for the purpose of simplicity and clarity and does not necessarily dictate a relationship between the various embodiments and/or configurations discussed. Instead, example embodiments are described herein to illustrate features and functionality of this disclosure. Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

Although the techniques are illustrated and described herein as embodied in one or more specific examples, it is nevertheless not intended to be limited to the details shown, since various modifications and structural changes may be made within the scope and range of the claims.

What is claimed is:

1. An apparatus comprising:
   a printed circuit board (PCB);
   a substrate with a finer structuring than the PCB, wherein a bottom surface of the substrate is coupled to the PCB;
   electro-optical components mounted on a top surface of the substrate, the electro-optical components including one or more optical components and one or more electrical components, wherein the one or more optical components are arranged to emit optical signals towards and/or receive optical signals from an area above the top surface of the substrate;
   an optical transfer assembly coupled to and extending from the substrate, wherein the optical transfer assembly includes one or more lenses to direct the optical signals toward and/or from the one or more optical components;
   a first thermal pathway formed in the substrate, wherein the first thermal pathway directs heat dissipated by the one or more optical components in a first direction;
   a second thermal pathway that directs heat dissipated by wherein the one or more electrical components in a second direction,
   wherein the first direction is opposite from the second direction;
   a thermal void positioned in the substrate laterally between the one or more optical components and the one or more electrical components; and
   a conductive pathway positioned in the substrate above the thermal void, wherein the conductive pathway operatively connects the one or more optical components to the one or more electrical components.

2. The apparatus of claim 1, wherein the electro-optical components further comprise an integrated circuit that is coupled to the top surface of the substrate via flip-chip bonding.

3. The apparatus of claim 1, wherein the one or more optical components include a laser that is coupled to the substrate via a wire bond so that the apparatus does not include chip-to-chip bond wires.

4. The apparatus of claim 1, wherein the thermal void defines a thermal boundary between the first thermal pathway and the second thermal pathway.

5. The apparatus of claim 1, wherein the first thermal pathway exits the substrate at the bottom surface of the substrate and the second thermal pathway extends in a direction away from the top surface of the substrate.

6. The apparatus of claim 5, further comprising a heat sink disposed above the substrate, the heat sink forming at least a portion of the second thermal pathway.

7. The apparatus of claim 1, wherein the substrate is coupled to the PCB via a ball grid array (BGA), wherein the first thermal pathway directs the heat dissipating from the one or more optical components downward through the substrate to the BGA, and wherein the BGA spreads the heat dissipating from the one or more optical components.

8. The apparatus of claim 1, wherein the conductive pathway is a conductive trace.

9. The apparatus of claim 1, wherein a bottom surface of the one or more optical components is secured to the top surface of the substrate via an adhesive material that conducts heat without deteriorating.

10. The apparatus of claim 1, wherein the thermal void divides the substrate into a first section and a second section, wherein the first section is associated with the one or more optical components and the second section is associated with the one or more electrical components.

11. An apparatus comprising:
a printed circuit board (PCB);
a substrate, wherein a bottom surface of the substrate is coupled to the PCB;
electro-optical components mounted on the substrate, the electro-optical components including one or more optical components and one or more electrical components, wherein the one or more optical components are arranged to emit optical signals towards and/or receive optical signals from an area above the substrate;
an optical transfer assembly extending upward from the substrate, wherein the optical transfer assembly includes one or more lenses to direct the optical signals towards and/or from the one or more optical components;
a first heat dissipation path formed in the substrate to direct heat dissipated by the one or more optical components;
a second heat dissipation path to direct heat dissipated by the one or more electrical components, wherein the first heat dissipation path and the second heat dissipation path extend in opposite directions;
a thermal void positioned in the substrate laterally between the one or more optical components and the one or more electrical components; and
a conductive pathway positioned in the substrate above the thermal void, wherein the conductive pathway operatively connects the one or more optical components and the one or more electrical components.

12. The apparatus of claim 11, wherein the electro-optical components further comprise an integrated circuit that is coupled to the substrate via flip-chip bonding.

13. The apparatus of claim 11, wherein the one or more optical components include a laser that is coupled to the substrate via a wire bond so that the apparatus does not include chip-to-chip bond wires.

14. The apparatus of claim 11, wherein the thermal void defines a thermal boundary between the first heat dissipation path and the second heat dissipation path.

15. The apparatus of claim 11, wherein the first heat dissipation path exits the substrate at the bottom surface of the substrate and the second heat dissipation path extends in a direction away from a top surface of the substrate.

16. The apparatus of claim 11, further comprising a heat sink disposed above the substrate, the heat sink forming at least a portion of the second heat dissipation path.

17. The apparatus of claim 11, wherein the substrate is coupled to the PCB via a ball grid array (BGA), wherein the first heat dissipation path directs the heat dissipating from the one or more optical components downward through the substrate to the BGA, and wherein the BGA spreads the heat dissipating from the one or more optical components.

18. The apparatus of claim 11, wherein the conductive pathway is a conductive trace.

19. The apparatus of claim 11, wherein a bottom surface of the one or more optical components is secured to a top surface of the substrate via an adhesive material that conducts heat without deteriorating.

20. The apparatus of claim 11, wherein the thermal void divides the substrate into a first section and a second section, wherein the first section is associated with the one or more optical components and the second section is associated with the one or more electrical components.

* * * * *

UNITED STATES PATENT AND TRADEMARK OFFICE
CERTIFICATE OF CORRECTION

| | | |
|---|---|---|
| PATENT NO. | : 12,470,041 B2 | Page 1 of 1 |
| APPLICATION NO. | : 17/381694 | |
| DATED | : November 11, 2025 | |
| INVENTOR(S) | : Christian Rainer Raabe et al. | |

It is certified that error appears in the above-identified patent and that said Letters Patent is hereby corrected as shown below:

In the Claims

Claim 1, Column 14, Lines 43-44, please replace "dissipated by wherein the one" with --dissipated by the one--

Signed and Sealed this
Twenty-seventh Day of January, 2026

John A. Squires
*Director of the United States Patent and Trademark Office*